US005799172A

United States Patent [19]
Gullapalli et al.

[11] Patent Number: 5,799,172
[45] Date of Patent: Aug. 25, 1998

[54] METHOD OF SIMULATING AN INTEGRATED CIRCUIT

[75] Inventors: Kiran Kumar Gullapalli; Brian J. Mulvaney; Steven D. Hamm; Steven R. Beckerich, all of Austin, Tex.

[73] Assignee: Motorola, Inc., Schaumburg, Ill.

[21] Appl. No.: 711,638

[22] Filed: Sep. 10, 1996

[51] Int. Cl.⁶ .................................................. G06G 7/48
[52] U.S. Cl. ........................ 395/500; 364/578; 364/488
[58] Field of Search ........................... 395/500; 364/578, 364/488–491

[56] References Cited

U.S. PATENT DOCUMENTS

| | | | |
|---|---|---|---|
| 4,967,386 | 10/1990 | Maeda et al. | 364/578 |
| 5,051,938 | 9/1991 | Hyduke | 364/578 |
| 5,650,946 | 7/1997 | Trimberger | 364/578 |

OTHER PUBLICATIONS

Kenneth S. Kundert, "Accurate Fourier Analysis for Circuit Simulators", IEEE 1994 Custom Integrated Circuits Conference, pp. 25–28.

Motorola, Chapter 12, "Signal post-processing in MCSPICE", pp. 12-1–12-13.

*Primary Examiner*—Kevin J. Teska
*Assistant Examiner*—Hani Mahmoud Kazimi
*Attorney, Agent, or Firm*—Keith E. Witek

[57] ABSTRACT

A method and apparatus for simulating the design of an integrated circuit uses a processor (200). The processor (200) executes a simulator (540) from memory (280) to exercise a model (544). The data points (15–27) of an output signal are stored in a history data file (542). The techniques used to generate each of the data points (15–27) are also stored in the history data in file (542). The history data are then used to generate a converted output signal that has a uniform time scale. If the converted output signal requires the generation of a desired data point, then the approximation technique used to generate the following data point stored in the history data (542) is used.

20 Claims, 5 Drawing Sheets

METHOD OF SIMULATING AN INTEGRATED CIRCUIT

FIELD OF THE INVENTION

This invention relates, in general, to integrated circuit design and manufacturing and, more particularly, to methods of simulating an integrated circuit.

BACKGROUND OF THE INVENTION

This invention relates, in general, to integrated circuit design and manufacturing and, more particularly, to methods of simulating an integrated circuit.

As part of the design of an integrated circuit, a computer simulation of the integrated circuit is generally used to verify its operation and performance before integrated circuits are manufactured on physical wafers. The simulation generates an output signal that represents an electrical property of the integrated circuit over time. For efficiency, such output signals are a sequence of data points that occur at non-uniform periods of time. For example, in a simulation that operates for 5 ns, a data point might be generated at 1 ns, 1.2 ns, 1.3 ns, 2 ns, and 5 ns time intervals. Such a simulation allows a representation of the output signal to be generated without having to determine data points at uniform intervals. This more efficient technique can result in a significant savings in simulation time and cost considering the complexity of the integrated circuit designed today.

To fully analyze the simulated performance of an integrated circuit, it is often necessary to study the operation of the circuit in the frequency domain using Fourier analysis. To perform Fast Fourier analysis on an output signal, it is necessary that data points of the output signal occur at uniform time intervals. Therefore, the set of data points that occur at non-uniform periods of time must be converted to a set of data points that occur at uniform time periods.

Continuing with the above example, the conversion of an output signal to an uniform time scale begins by first determining which data points are already available from the original simulation and which data points must be generated. If the time interval is 1 ns, then the data points that occurred at 1 ns, 2 ns, and 5 ns are already available from the simulation. Unfortunately, the data points that occur at 3 ns and 4 ns must be approximated since actual data points for the 3 ns and 4 ns time periods are not available from the simulation. Currently, one generic approximation equation is used to generate the missing data points.

The problem with this technique is that the generic approximation equation is unstable and can generate a data point that has an error that exceeds a user specified tolerance. The tolerance is the amount of error a user is willing to accept in return for the reduced simulation time. Accordingly, it would be advantageous to provide a simulation method that approximated data points such that the error value of each of the data points is commensurate with the tolerance of the original simulation.

Figure 1:
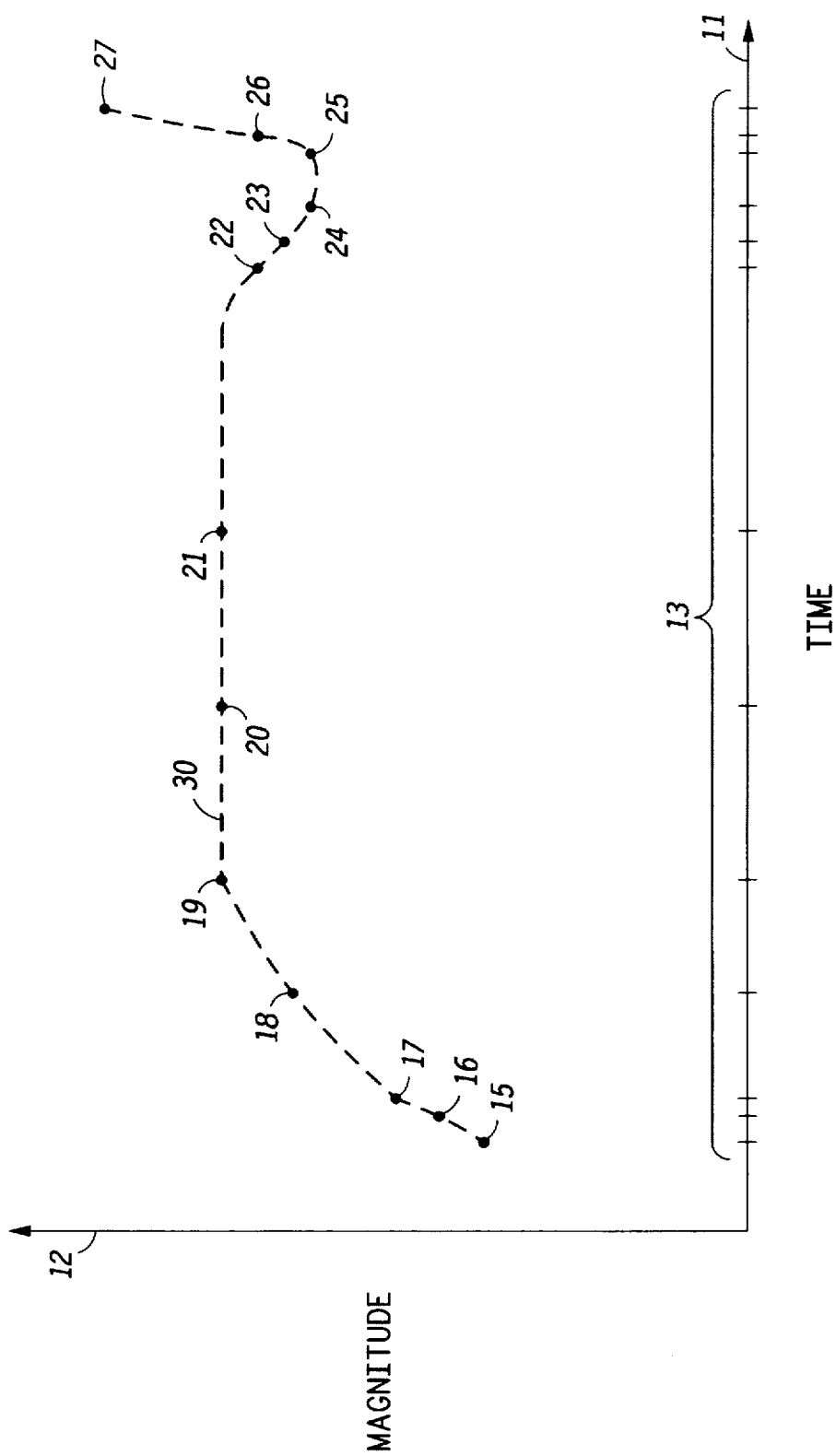
FIG. 1 is a graph of an output signal having a non-uniform time scale provided by a simulator in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF THE PREFERRED EMBODIMENT(S)

In general, the present invention provides a novel method and apparatus for simulating an integrated circuit to provide an output signal. The output signal of the simulation can represent many of the electrical properties of an integrated circuit. For example, a simulation can be performed to predict a voltage or a current value that occurs at a particular node in the integrated circuit over time. The present invention provides a method for improving the process used to generate the output signals of a simulation so that a uniform FFT-compatable output is achieved. It should also be understood that the simulation technique can be used for other purposes as will become apparent to one skilled in the art from the text that follows.

Simply stated, the simulation generates a sequence of data points that are used to represent an output signal. Each of the 5 data points is calculated at non-uniform time intervals to reduce the total simulation time and cost. Each of the data points is generated using an approximation technique that approximates the true value of a data point based on a model of the integrated circuit. The technique that was used to generate each of the data points is stored into memory, such as a history file, for later use.

For some applications, it is necessary to convert the output signal from a non-uniform time scale to a converted output signal consisting of a sequence of data points that occur at uniform time periods. To do the conversion, it may be necessary to approximate a desired data point at a uniform time period that does not coincide with a data point from the original output signal. In accordance with the present invention, this desired data point is approximated using the same approximation technique that was used to generate the subsequent or following data point of the original output signal. Since this information was stored in a history file, it is readily available for use.

Previously known techniques do not record in a history file the approximation technique used to generate each data point.

Instead, previous techniques must use a generic approximation equation to calculate the missing data points along the uniform time scale that does not relate to history. Again, the present invention differs in that the approximation technique that was used to generate each of the data points of the original output signal is stored in a history data file. This allows each desired or missing data point in the converted output signal to be generated using the most appropriate approximation equation for that particular point in time. As a result, the present invention provides a converted output signal comprising data points that have less error than a converted output signal that is generated using a generic approximation equation as used by the prior art. Thus, the error of each data point of the converted signal is commensurate with the tolerance setting of the original simulation.

In the example that follows, the method of the present invention is used to convert a set of data points occurring at non-uniform time intervals to a set of data points occurring at uniform time intervals. It should be understood that the present invention has applications where data points of a waveform need to be calculated that were not generated previously by a simulation. Reference to time scales is not intended to limit the present invention, as this technique could be used to generate a set of data points that are a function of temperature, voltage, pressure, etc..

FIG. 1 is a graph 10 of an output signal from a simulation of an integrated circuit. The simulation uses a computer model that mimics the operation of the integrated circuit under different operating conditions and at various points in time. The model is generally a mathematical or computer-rendered representation of an integrated circuit that typically comprises a plurality of differential equations. The method for determining the differential equations to be used in the model are well known and are described in, for example. "Computer methods for circuit analysis and design," by Vlach and Singhal. Published by Van Nostrand Reinhold, 1994.

The method of the present invention can be incorporated into a software simulator using conventional programming algorithms well known by one skilled in the art. One such simulator that can benefit from the method of the present invention is SPICE. SPICE stands for Simulation Program with Integrated Circuit Emphasis which is a software program developed and provided by the University of California in Berkeley, Calif. It will also be understood that the method could also be incorporated into a simulator using a hardware implementation.

In particular, FIG. 1 is a graph 10 containing an X—Y plot of an output signal (line 30). The output signal comprises a sequence of data points 15–27. The waveform illustrated by line 30 is the output of a simulation and might indicate the voltage at a node in an integrated circuit. Data points 15–27 are plotted along an x-axis 11 as a function of time wherein the data points 15–27 occur at non-uniform time intervals. The various time intervals where data points 15–27 occur are shown in FIG. 1 with hash marks along the x-axis 11 (also indicated collectively with bracket 13). The value of the output signal, also referred to as original output signal, varies in magnitude with time and the magnitude is plotted along y-axis 12. The y-axis 12 represents the value of a voltage output, current measurement, impedence, capacitance, or a like characteristic at different time intervals. A description of how data points 15–27 are generated will follow. To minimize the amount of time it takes a simulation to generate an output signal (i.e. line 30), individual data points are generated non-uniformily rather than calculating a data point at finite time intervals which provide a smooth curve. This is why the output signal is shown in FIG. 1 as a dashed line 30.

Once the simulation is complete, it may be necessary to plot the output signal generated using data points at non-uniform time intervals on a graph with data points that occur at uniform time intervals. This may be necessary to perform various types of analysis on the output signal. Such analysis includes Fast Fourier Transform (FFT) analysis.

Figure 2:
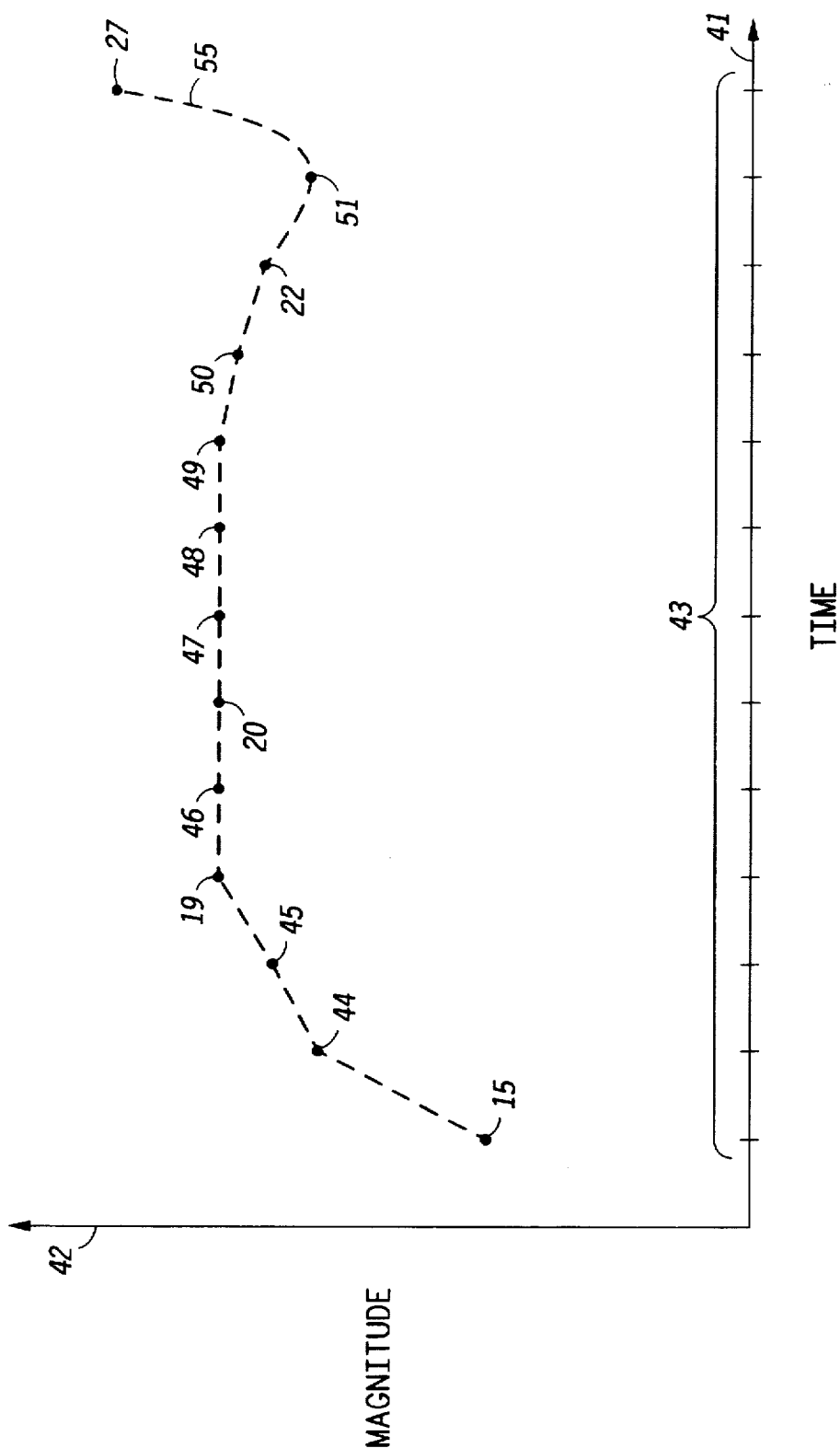
FIG. 2 is a graph of a converted output signal having an uniform time scale provided by the simulator in accordance with the present invention.

FIG. 2 is a graph 40 of a converted output signal (line 55).

Line 55 is a representation of the original output signal shown in FIG. 1, but instead, the data points 15, 20, 22, 27, and 44–51 of FIG. 2 occur at uniform time intervals. The time intervals are indicated along the x-axis 41 with hash marks (bracket 43 encompasses all x-axis hask marks). The value of the converted output signal is shown along y-axis 42 and should ideally approximate the shape and value of the original output signal shown in FIG. 1.

Figure 3:
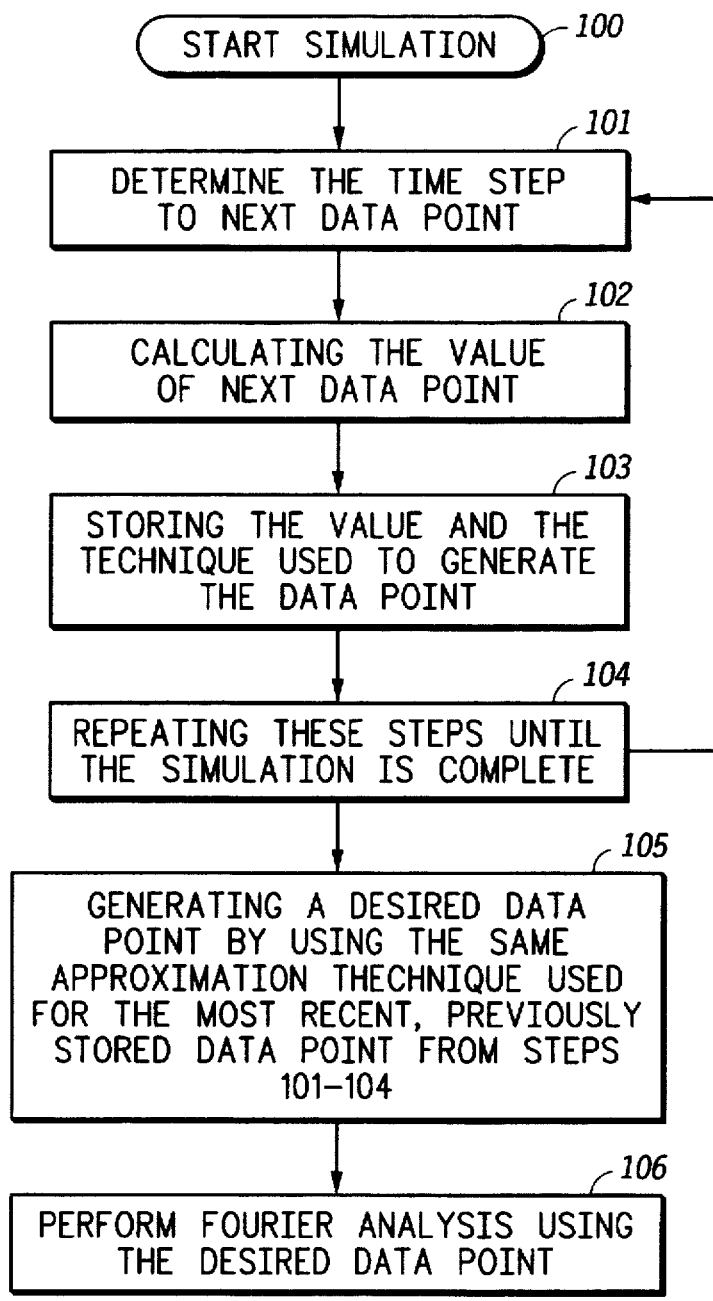
FIG. 3 is a flow chart of the method of operation used by the simulator to provide the output signal in accordance with the present invention.

FIG. 3 is a flowchart summary of the method of the present invention. The method illustrated can be implemented using either software (i.e. computer opcode instructions) or hardware (i.e. logic gates, switches, etc.). For clarity, the method of the present invention is divided into modules (boxes 100–106) which in combination provide the improved simulation technique. It should be understood that each module can be implemented as a separate software module/routine, such as separate procedures in a computer program, or combined in part or in total into one large computer program. It will be understood by one skilled in the art that some of the modules may be optional, depending on the nature of the integrated circuit and the type of simulation that is desired.

The method begins by initializing and starting the circuit simulation program (FIG. 3, box 100). Initialization includes the setting of parameters that determine the conditions under which the integrated circuit operates. The simulation is started by sending an initiation signal to the computer model and opening a file in a computer readable medium to store the history data that is generated by the simulation. The history file is used to keep a record of the method used to generate each data point of the simulation as illustrated in FIG. 1. This information is then subsequently used so that the same method, which is stored appropriately in the history file, can be used to generate data points that occur prior to the same time interval. It should also be understood that the history file can be stored directly in memory that is either external or internal to a processor that is running the simulation program. This storage could be done using registers pointing to a table format in the memory. The memory used to store the software and history data herein may be one or more of static random access memory (SRAM), dynamic random access memory (DRAM), ferroelectric, ferromagnetic, non-volatile memory (NVRAM), compact discs (CDs), magnetic memory, tape storage, floppy disk, hard disk, optical storage, read only memory (ROM), EEPROM, EPROM, and/or like computer memory elements.

The next step 101 is performed to determine the appropriate approximation technique to use to generate the next data point for FIG. 1. In the example that follows, a polynomial equation is used to generate each data point of an output signal. This is only intended to provide an example of an approximation technique and is not considered part of the present invention nor should it be considered a limitation of the present invention. In general, the present invention records how each data point is generated so that the same method can be used when an output signal must be plotted on a uniform time scale. Therefore, the actual approximation technique used to calculate each data point is not important and any approximation technique can be used to render the points of FIG. 1.

One way to determine the next time interval is to select from a plurality of equations the equation that provides a data point with the largest increase in time from a previous data point. This will minimize the number of data points that must be generated to provide an accurate representation of the output signal in FIG. 1. The approximation equation that is used must also provide a data point that is within an error tolerance specified by the user or that is one of the simulation parameters. This ensures that the simulation runs as quickly as possible, but still provides a result that is a reliable representation of an integrated circuit (IC). If there is no previous data point, then the equation that provides the largest increase from time zero is selected. Table 1 below is a list of possible equations that could be used to generate each of the data points of FIG. 1. Also shown in Table 1 is a technique data value that indicates which approximation equation was used.

TABLE 1

| Technique data value | Approximation Equation |
|---|---|
| 1 | $At + K1$ |
| 2 | $Bt^2 + Ct + K2$ |
| 3 | $Dt^3 + Et^2 + Ft + K3$ |
| 4 | $Gt^4 + Ht^3 + It^2 + Jt + K4$ |
| 5 | $Kt^5 + Lt^4 + Mt^3 + Nt^2 + Ot + K5$ |

Constants A–O and K1–K5 are adjusted based on the values of previous data points and (t) is the value of time along the x-axis of FIG. 1. If there have not been enough previous data points to calculate all of the constants (i.e., if you are providing the first couple output points to a left of FIG. 1 to begin plotting operations), then a lower order equation must be used. This is because there are not enough data points to solve for each of the constants in the approximation equation. For example, if only four data points have been calculated (such as data points 15–18 of FIG. 1), then a fourth order equation cannot be used to generate data point 19 and only a third order or less equation must be used due to the lack of previously existing data points. The order of an equation refers to the largest exponent in the equation. If a third order or lower equation must be used, then only the equations corresponding to technique data values 1 through 3 can be used to perform proper output line generation.

To determine the approximation equation to use, each equation of Table 1 is evaluated to verify that the result is within a tolerance determined by the user of the simulation program. The tolerance is the maximum amount of error that is allowed from the approximation technique and is typically a percentage of an actual value of the data point. The actual value is calculated using the model rather than one of the approximation equations above. The approximation equation that provides a data point that is furthest in time from the last data point in the output signal, but is within the tolerance from the actual data point value, is the one that is chosen to provide the next data point in FIG. 1.

Continuing with the above example, if the third equation (technique data value 3) allows the largest increase in time interval from data point 18 of FIG. 1, then this equation is used to calculate data point 19 of FIG. 1 as illustrated via a step 102 of FIG. 3. Because an approximation equation was used, the value of data point 19 may not be identical the actual value if the model had been used to generate the data point. Therefore, each data point will have an error value associated with it, but this error value will be within a user specified tolerance thereby resulting in an adequate output representation.

Once a data point has been generated, both the value of the data point and the technique data value (which identifies the approximation used to generate that point) are stored in the history data via step 103 of FIG. 3. Again, the history data is the mechanism used by the simulation program to record the method used to generate each of the data points of an output signal so that non-uniform points in FIG. 1 can be converted to uniform points in FIG. 2.

This sequence of steps 101–104 is repeated via looping step 104 until all the data points 15–27 of the output signal are generated. As a result of the approximation technique described above, each of the data points 15–27 will lie along the x-axis 11 at non-uniform time intervals, and each data point 15–27 may be generated using an approximation equation that is different than the one used to generate adjacent data points. Each of these potentially different approximation methods are stored in the history file and associated with a specific output data point.

The method described above provides graph 10 of FIG. 1, which is a representation of an output signal plotted in the time domain. Again, the output signal can represent a physical or electrical property of an integrated circuit over the simulation time based on the model used to mimic the integrated circuit. Since graph 10 consists of data points that occur at non-uniform time intervals, it cannot be used in its present form to perform Fast Fourier transform (FFT) analysis. In order to perform FFT analysis, the output signal of graph 10 must be converted to a converted output signal that has data points at an uniform time interval (see FIG. 2). To generate the converted output signal (line 55) of FIG. 2, data points 15, 20, 22, 27, and 44–51 are plotted at a user-defined uniform time interval (i.e., 1 nanosecond in this example). At some of these uniform time intervals of FIG. 2 there may be some data points that coincide with the data point generated in the original output signal of FIG. 1. In the example shown in FIG. 2, the values of data points 15, 19, 20, 22, and 27 can be reused without having to perform any addition calculations since these points fall on the 1 ns intervals selected by the user.

The missing data points 44, 45, 46, 47–50, and 51, however, must be generated in order to have a data point at each of the uniform time intervals along the x-axis 41 (FIG. 2). These data points 44,45,46,47–50, and 51 will be initially missing from FIG. 2 and require generation in FIG. 2 because no original points from FIG. 1 occur at these 1 ns time interval periods. For example, data point 45 must be approximated since it is not available in the original output signal of FIG. 1. To generate this desired data point 45, the approximation technique that was used to generate data point 19 (identified in the history table) is used to generate the data point 45 in FIG. 2. The approximation information for each point is stored in the history data and is available to approximate new uniform time-interval points within error constraints. Thus, the third equation in table 1 (technique data value=3) is used to generate data point 45 if the equation 3 from Table 1 is the approximation equation associated with point 19. This process is repeated to generate each of the desired or missing data points 44, 45, 46, 47–50, and 51 of graph 40. Note that all points not lying on a uniform time interval (like points 16, 17, and 18 of FIG. 1) are removed from FIG. 2.

Now that an output signal along a uniform time scale (graph 40) has been generated, it is possible to perform analysis on the converted output signal in the frequency domain. Either a Fourier transform analysis or a fast Fourier transform analysis can be performed (FIG. 3, box 106) to extract such information as frequency response, frequency amplitude, and linearity of the simulated integrated circuit. The information provided by graph 40 could also be used to re-simulate a portion of the integrated circuit or to provide a value of the output signal at a user specified time. The information could also be used to generate a smooth waveform for plotting.

One advantage of the present invention is that the error value associated with data point 45 will be less than or equal to the error value associated with data point 19 since the same approximation equation was used. In contrast, previously known techniques differ in that no record is kept of how each data point is generated. Thus, one generic equation is used to approximate all of the missing data points of an output signal. This one equation is predetermined and the choice of the equation is not based on the equations that were used to generate previous data points in the simulation. As a result, the error value associated with the approximated data points of the previously known technique can greatly exceed the tolerance for the simulation. The present invention, however, offers a method that ensures that the error value of each data point on graph 40 is within the user specified tolerance.

Another advantage of the present invention is that it allows a user to adjust the time interval of the uniform time scale without having to re-run the simulation. Since the data value of each data point and the technique used to generate each data point is stored in the history data, the converted output signal can be generated without having to recalculate each of the original data points 15–27.

Using the information provided by the simulation, it is possible to test the operation of an integrated circuit without having to actually fabricate the circuit. Once proper operation has been confirmed, the integrated circuit can be fabricated using techniques well known in the art.

The method of present invention can be used to improve an integrated circuit simulation that is implemented in either software or hardware. A software implementation would involve the use of a central processing unit (CPU) that executes instructions that performs the simulation based on the definition of the integrated circuit provided by a model. The model and the instructions can be stored in memory that is either external or internal to the CPU. As the CPU performs the simulation of the integrated circuit, the value of the data points and the approximation technique used to generate each of the data points is stored in a history data. The history data can also be stored in memory that is either external or internal to the CPU.

Figure 4:
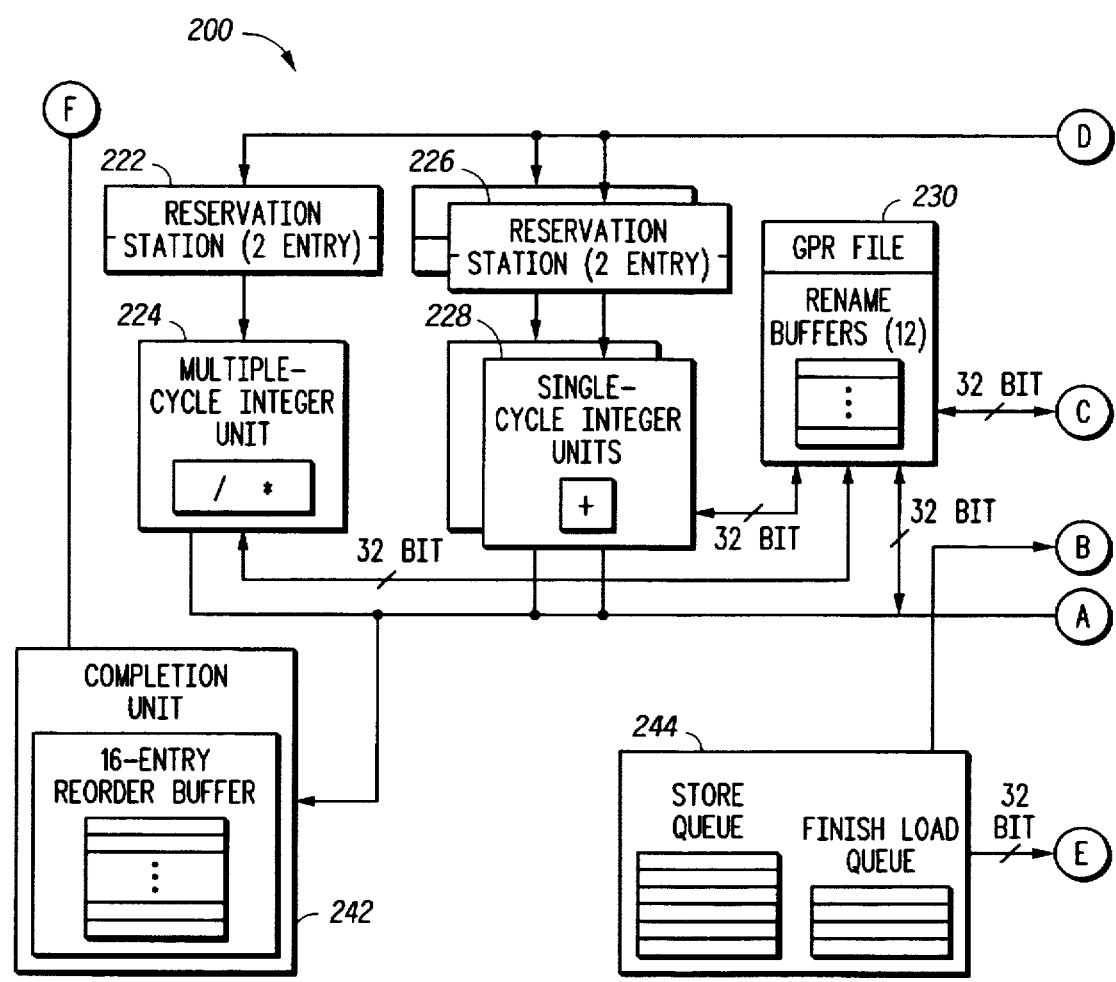
FIGS. 4 and 5 together are a block diagram illustrating one specific example of a data processing system implementing the present invention.
Figure 5:
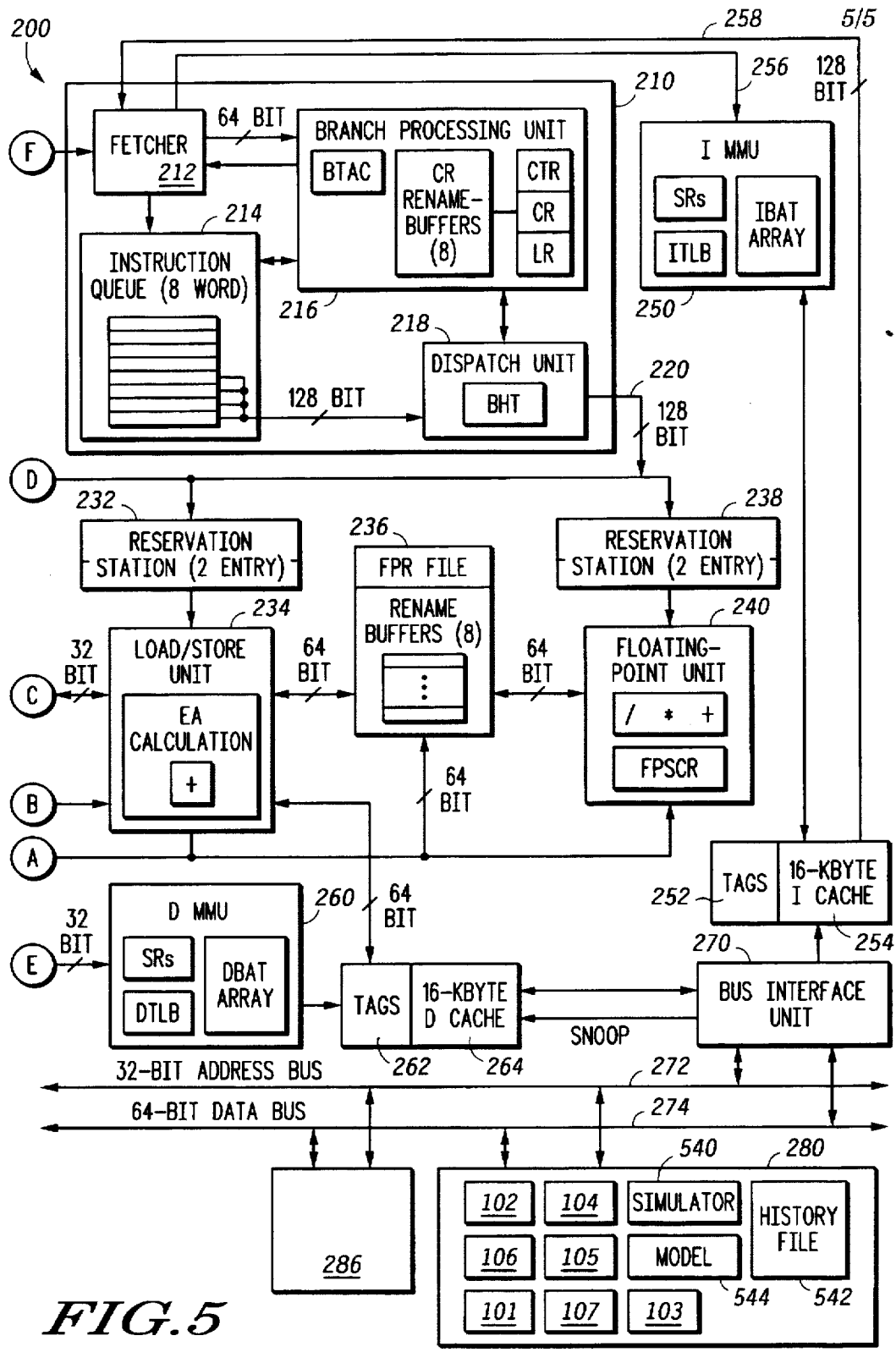

A specific example of a CPU that can be used to perform the method of the present invention is now provided. It should be understood that this specific example is not intended to limit the present invention to this particular example. FIGS. 4 and 5 together illustrate a data processing system which can be used to perform the simulation methods as taught herein. FIGS. 4 and 5 illustrate a central processing unit (CPU) portion 200 which is coupled via a 32 bit address bus 272 and a 64 bit data bus 274 to external memory 280. The central processing unit (CPU) 200 has a fetch unit 212. The fetch unit 212 is responsible for fetching computer instructions from the 16 kilobit I (Instruction) cache 254 via the 128 bit bus 258 making use of the instruction memory management unit (IMMU) 250. The fetch unit 212 provides instructions which fill an eight instruction queue 214 as illustrated in FIG. 5. The fetch unit 212 continues to fetch as many as four instructions at a time to ensure that the queue 214 is continually filled with instructions, which can be processed by the CPU portion 200.

A branch processing unit 216, which contains branch prediction information, is used to control the fetcher 212 so that the proper execution flow of instructions is maintained within the instruction queue 214. A dispatch unit 218 is provided to decode the instructions and issue the instructions to an appropriate execution unit as illustrated in a central portion of FIGS. 4 and 5. The dispatch unit 218 can provide decoded instructions to one of four types of execution unit illustrated in a middle portion of FIGS. 4 and 5. These four types are the floating point unit 240, the load/store unit 234, the single cycle integer units 228, and the multiple cycle integer unit 224. The units 218, 216, 214, and 212 are all portions of a larger instruction unit 210 which is responsible for providing a continual stream of instructions to one of the many execution units of FIGS. 4 and 5.

Instructions are provided via a 128 bit bus 220 to reservation stations 222, 226, 232, and 238 as illustrated in FIGS. 4 and 5. Each of the reservation stations 222, 226, 232, and 238 feeds one or more execution units 224, 228, 234, and 240. These execution units 224, 228, 234, and 240 will execute the decoded instructions provided by the instruction unit 210. During the execution of instructions, various general purpose registers stored in a General Purpose Register (GPR) File region 230 and various floating point registers stored in a Floating Point Register (FPR) File region 236 may be accessed by the execution units. In addition, the load/store unit 234 can access store queues and finish load queues 244, a D (Data) cache 264 associated with data cache tags 262, and a data cache memory management unit 260. The load/store unit 234 can access this information in order to maintain the integrity of the internal data of the processing unit 200.

A bus interface unit 270 interfaces to the external busses 272 and 274. The bus interface unit 270 places instructions into an I (Instruction) cache 254 associated with instruction tags 252. Data is also read from external memory via the bus interface unit 270 and placed within the D (Data) cache 264. Instructions are also provided as previously discussed via the instruction memory management unit (MMU) 250 to the instruction fetch unit 212. Once the instructions have been provided through the instruction unit and processed appropriately via the execution units 224, 228, 234, and 240, instructions are retired to a completion unit 242. The completion unit 242 compensates for out of order execution and for mispredicted branches and is generally the end of a pipeline prosecution sequence within the processor 200.

The 32 bit address bus 272 and the 64 bit data bus 274 are coupled to external memory 280 and computer readable media 286. External memory 280 contains seven sets of instructions which are used to perform specific operations within the hardware unit 200. Specifically, memory 280 contains seven software program portions 100, 101, 102, 103, 104, 105, 106, and 107 which respectively correspond to the steps 100, 101, 102, 103, 104, 105, 106, and 107 of FIG. 3. Therefore, the CPU 200, by accessing external memory 280, can execute a simulator 540 and access a model 544, which are stored in external memory 280. This allows CPU 200 to perform the simulations steps as taught herein via FIG. 1 through FIG. 3. Data points 15–27 and their respective technique data values are stored in history file 542 for use by simulator 540 and model 544.

The method taught herein may be provided to enable integrated circuit simulation via articles of manufacture which are manufactured to contain the software elements 540 and 544. The software portions 100, 101, 102, 103, 104, 105, 106, and 107 stored in memory 280 are typically loaded into memory 280 from computer readable media 286 such as: electrically programmable read only memory (EPROM), electrically erasable and programmable read only memory (EEPROM), read only memory (ROM), dynamic random access memory (DRAM), static random access memory (SRAM), magnetic storage, tape storage, optical storage, compact discs (CDs), flash memory storage, network storage, another computer across a communications link, or like storage device for computer executable code, or computer data.

By now it should be appreciated that the present invention provides an improved integrated circuit simulator and method of operating the same. The method of the present invention records the technique used to generate each data point that occurs at non-uniform time intervals. This recorded information is used to generate data points that occur at uniform time intervals. The technique that is used to generate the following data point in the simulation is the same technique used when a data point at one of the uniform time intervals must be generated.

Those skilled in the art will recognize that modifications and variations can be made without departing from the spirit of the invention. Therefore, it is intended that this invention encompass all such variations and modifications that fall within the scope of the appended claims.

We claim:

1. A method for simulating an integrated circuit by storing history data while exercising the integrated circuit and then using that history data to generate a desired data point, the method comprising the steps of:
   a) providing a model of the integrated circuit in computer readable media;
   b) providing an initiation signal to the model to begin generating an output signal, wherein the output signal is a sequence of data points as a function of time, and the output signal represents a property of the integrated circuit;
   c) generating a data point of the output signal using a selected approximation technique selected from a plurality of different possible approximation techniques;
   d) storing a value of the data point in the history data;
   e) storing a technique data value in the history data that indicates the selected approximation technique used for generating the data point;
   f) repeating steps (c) through (e) for a simulation time to provide the sequence of data points; and
   g) generating the desired data point at a uniform time interval that occurs adjacent and adjacent data point of the sequence of data points, wherein the desired data point is generated using the selected approximation technique used for generating the subsequent data point as identified by the history data.

2. The method of claim 1 further comprising the step of repeating the step of generating the desired data point to provide a converted output signal that has a plurality of data points along a uniform time scale.

3. The method of claim 2 further comprising the step of performing a Fast Fourier Transform analysis on the converted output signal.

4. The method of claim 1 wherein the step of generating the data point using the selected approximation technique includes determining which of a plurality of equations that provides a data point with a largest increase in time from a previous data point and the data point has an error value that is less than a tolerance value, the error value being determined by comparing the data point that is determined using one of the plurality of equations to an actual value generated by the model of the integrated circuit.

5. The method of claim 4 wherein the step of generating the desired data point includes generating a desired data point that has an error value that is less than or equal to an error value of the subsequent data point.

6. The method of claim 1 wherein the step of generating the data point generates a data point at a non-uniform time interval.

7. The method of claim 1 wherein the model of the integrated circuit comprises a plurality of differential equations.

8. The method of claim 1 wherein the step of storing the technique data value in the history data includes storing the data value in a computer readable memory.

9. The method of claim 8 wherein the computer readable memory is selected from the group consisting of static random access memory (SRAM), read only memory (ROM), dynamic random access memory (DRAM), flash memory, electrically erasable programmable read only memory (EEPROM), erasable programmable read only memory (EPROM), ferroelectric memory, and ferromagnetic memory.

10. A method of manufacturing an integrated circuit comprising the steps of:
   a) providing a model of the integrated circuit in a computer readable memory, wherein the model comprises a plurality of equations that operate in a time domain to represent operation of at least a portion of the integrated circuit;
   b) generating an original output signal, wherein the original output signal is a sequence of data points that occur over the time domain;
   c) determining an appropriate next data point by determining which of a plurality of approximation equations provides a data point that is furthest in time from a last data point of the original output signal, but is within a tolerance from an actual data point value;
   d) storing a value corresponding to the appropriate next data point in a history data;
   e) storing a technique data value in the history data that indicates which of the plurality of approximation equations was used for generating the appropriate next data point;
   f) repeating steps (c) through (e) for a simulation time period of the integrated circuit to provide the sequence of data points of the original output signal;
   g) generating a converted output signal having a uniform time scale, wherein the converted output signal comprises converted data points that are determined by using the technique data value from a most recent data point from the original output signal to determine which of the plurality of approximation equations is used to calculate each of the converted data points; and
   h) fabricating the integrated circuit after step (g).

11. The method of claim 10 further comprising the step of performing a Fast Fourier Transform analysis on the converted output signal.

12. The method of claim 10 wherein the step of repeating steps (c) through (e) provides a sequence of data points that occur at non-uniform time intervals.

13. The method of claim 10 wherein the step of generating an original output signal provides an original output signal that represents a property of the integrated circuit over time.

14. A simulator for generating an output signal of an integrated circuit comprising:
   means for generating a plurality of data points from a plurality of approximation equations;
   means for storing the plurality of data points, which represent the output signal of the integrated circuit;
   means for indicating which of the plurality of approximation equations is used to generate each of the plurality of data points; and
   means for generating a converted output signal having a uniform time scale and a plurality of data points, wherein at least one of the plurality of data points of the converted output signal is generated from an approximation equation used for generating a subsequent data point of the plurality of data points of the output signal.

15. The simulator of claim 14 wherein the simulator is a computer program and the means for storing, means for generating, and means for indicating are computer code segments stored on magnetic media.

16. The simulator of claim 14 wherein the simulator is a computer program and the means for storing, means for generating, and means for indicating are computer code segments stored via selectively etched trenches on an optical disk.

17. The simulator of claim 14 wherein the simulator is a computer program and the means for storing, means for generating, and means for indicating are computer code segments stored as binary values in integrated circuit storage comprising one or more of: static random access memory (SRAM), read only memory (ROM), dynamic random access memory (DRAM), flash memory, electrically erasable programmable read only memory (EEPROM), erasable programmable read only memory (EPROM), ferroelectric memory, and ferromagnetic memory.

18. A simulator stored on a storage media, the storage media comprising:

a first plurality of binary values for generating a plurality of data points from a plurality of approximation equations;

a second plurality of binary values for storing the plurality of data points, which represent an output signal of the simulator of an integrated circuit;

a third plurality of binary values for indicating which of the plurality of approximation equations is used to generate each of the plurality of data points; and a fourth plurality of binary values for generating a converted output signal of the simulator having a uniform time scale, wherein the converted output signal comprises a plurality of data points and at least one of the plurality is generated from an approximation equation used for generating a subsequent data point of the plurality of data points of the output signal.

19. The simulator of claim 18 wherein the plurality of data points occur at non-uniform time intervals.

20. The simulator of claim 18 wherein the plurality of approximation equations are a plurality of polynomial equations.

* * * * *